United States Patent
Tan et al.

(10) Patent No.: US 9,128,501 B2
(45) Date of Patent: Sep. 8, 2015

(54) REGULATOR CIRCUITRY CAPABLE OF TRACKING REFERENCE VOLTAGES

(71) Applicant: Altera Corporation, San Jose, CA (US)

(72) Inventors: Kok Siang Tan, Semenyih (MY);
Chuan Khye Chai, Bayan Lepas (MY);
Wilfred Wee Kee King, Kuching (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/023,778

(22) Filed: Sep. 11, 2013

(65) Prior Publication Data
US 2015/0070086 A1    Mar. 12, 2015

(51) Int. Cl.
*G05F 3/02* (2006.01)
*G05F 3/16* (2006.01)
*G05F 3/24* (2006.01)
*G05F 1/46* (2006.01)
*G11C 5/14* (2006.01)

(52) U.S. Cl.
CPC ...... *G05F 3/16* (2013.01); *G05F 1/461* (2013.01); *G05F 1/465* (2013.01); *G05F 3/02* (2013.01); *G05F 3/247* (2013.01); *G11C 5/147* (2013.01)

(58) Field of Classification Search
CPC ......... G11C 5/147; G05F 3/247; G05F 1/465; G05F 1/461; G05F 3/02
USPC ............ 327/540, 72, 73, 530, 538, 541, 543, 327/544, 545, 546, 562, 563
See application file for complete search history.

(56) References Cited

U.S. PATENT DOCUMENTS

| 5,894,215 | A | 4/1999 | Yazdy et al. |
| 5,936,455 | A * | 8/1999 | Kobayashi et al. ............ 327/437 |
| 6,628,162 | B2 * | 9/2003 | Kondo et al. ................. 327/540 |
| 6,686,726 | B1 | 2/2004 | Boylan |
| 7,116,088 | B2 | 10/2006 | Tran et al. |
| 2007/0216473 | A1 * | 9/2007 | Yamazaki et al. ............ 327/540 |

FOREIGN PATENT DOCUMENTS

WO    0106628    1/2001

* cited by examiner

*Primary Examiner* — Jung Kim (57) ABSTRACT

An integrated circuit having a regulator circuit capable of tracking reference voltages is provided. The integrated circuit includes shunt regulator circuitry. The shunt regulator circuitry includes a shunt regulator circuit and a voltage tracking circuit. The shunt regulator circuit has an output on which a regulated voltage is provided. The shunt regulator circuit also provides electrical current to the output when the regulated voltage is outside of a voltage range bounded by first and second reference voltages. The voltage tracking circuit may be coupled to the shunt regulator circuit. The voltage tracking circuit may generate the first and second reference voltages. In one instance, the first voltage is greater than the regulated voltage and the second voltage is less than the regulated voltage.

20 Claims, 5 Drawing Sheets

REGULATOR CIRCUITRY CAPABLE OF TRACKING REFERENCE VOLTAGES

BACKGROUND

A regulator circuit may generally be used in an integrated circuit to regulate voltages received from an external source. The regulator circuit can be used to ensure that circuitry within the integrated circuit receives supply voltages that are within a predetermined range even when the voltages from an external voltage supply deviate from their nominal levels due to factors such as signal noise, temperature variation, etc.

Typical regulator structures include series voltage regulators and analog shunt regulators. However, other types of regulators such as push-pull shunt regulators have also been increasingly used to regulate voltages in integrated circuits. Unlike linear series voltage regulators and analog shunt regulators, push-pull shunt regulators may overcome the problem of large shunt electrical current getting drawn to ground. Generally, push-pull shunt regulators may reduce voltage headroom and may require fewer area intensive compensation capacitors such as those commonly used in analog shunt regulators.

Conventional push-pull shunt regulators often utilize reference voltages generated using bandgap reference circuits to provide reference voltages that are relatively invariant in the presence of signal noise and power supply voltage fluctuations. When the regulated voltage goes above a reference voltage, the push-pull shunt regulator may source or sink the electrical current so that the electrical current returns to its nominal level. If the average regulated voltage is outside a target range of the reference voltage, the push-pull shunt regulator will continue to sink or source the electrical current, respectively, even in the absence of supply voltage noise. This result in undesirable compensation and it may be necessary to manually program the reference voltage of the bandgap reference circuit to avoid such undesirable compensation.

It is within this context that the embodiments described herein arise.

SUMMARY

Embodiments described herein include a regulator circuit capable of tracking reference voltages and a method of operating the regulator circuit. It should be appreciated that the embodiments can be implemented in numerous ways, such as a process, an apparatus, a system, a device, or a method. Several embodiments are described below.

In one embodiment, an integrated circuit having a regulator circuit capable of tracking reference voltages is described. The integrated circuit includes a shunt regulator circuit and a voltage tracking circuit. The shunt regulator circuit has an output on which a regulated voltage is provided. The shunt regulator circuit also provides an electrical current to the output when the regulated voltage is outside of a voltage range bounded by first and second reference voltages. The voltage tracking circuit may be coupled to the shunt regulator circuit. The voltage tracking circuit may generate the first and second reference voltages. In one instance, the first voltage is higher than the regulated voltage and the second voltage is lower than the regulated voltage.

In another embodiment, an integrated circuit is disclosed. The integrated circuit includes a shunt regulator circuit and a tracking circuit. The shunt regulator circuit has an output on which a regulated voltage is provided. The shunt regulator circuit provides a direct current path between the output and a selected power supply line when the regulated voltage is outside a voltage range that is bounded by first and second reference voltages. The tracking circuit generates the first and second reference voltages. The tracking circuit has an input that receives the regulated voltage from the shunt regulator circuit and has first and second outputs on which the first and second reference voltages are provided, respectively. The first and second outputs are coupled to corresponding control inputs of the shunt regulator circuit.

In an alternative embodiment, a method of operating a shunt regulator circuit having a voltage tracking circuit and comparator circuits is disclosed. The method includes receiving a regulated voltage at an input-output terminal. The method also includes generating reference voltages with the tracking circuit. The reference voltages are offset from the regulated voltage by a voltage difference. The method may further include providing the reference voltages to the comparator circuits.

Further features of the invention, its nature and various advantages will be more apparent from the accompanying drawings and the following detailed description of the preferred embodiments.

DETAILED DESCRIPTION

The following embodiments describe a regulator circuit capable of tracking reference voltages and a method to operate the regulator circuit. It will be obvious, however, to one skilled in the art, that the embodiments described herein may be practiced without some or all of these specific details. In other instances, well-known operations have not been described in detail in order not to unnecessarily obscure the present embodiments.

Figure 1:
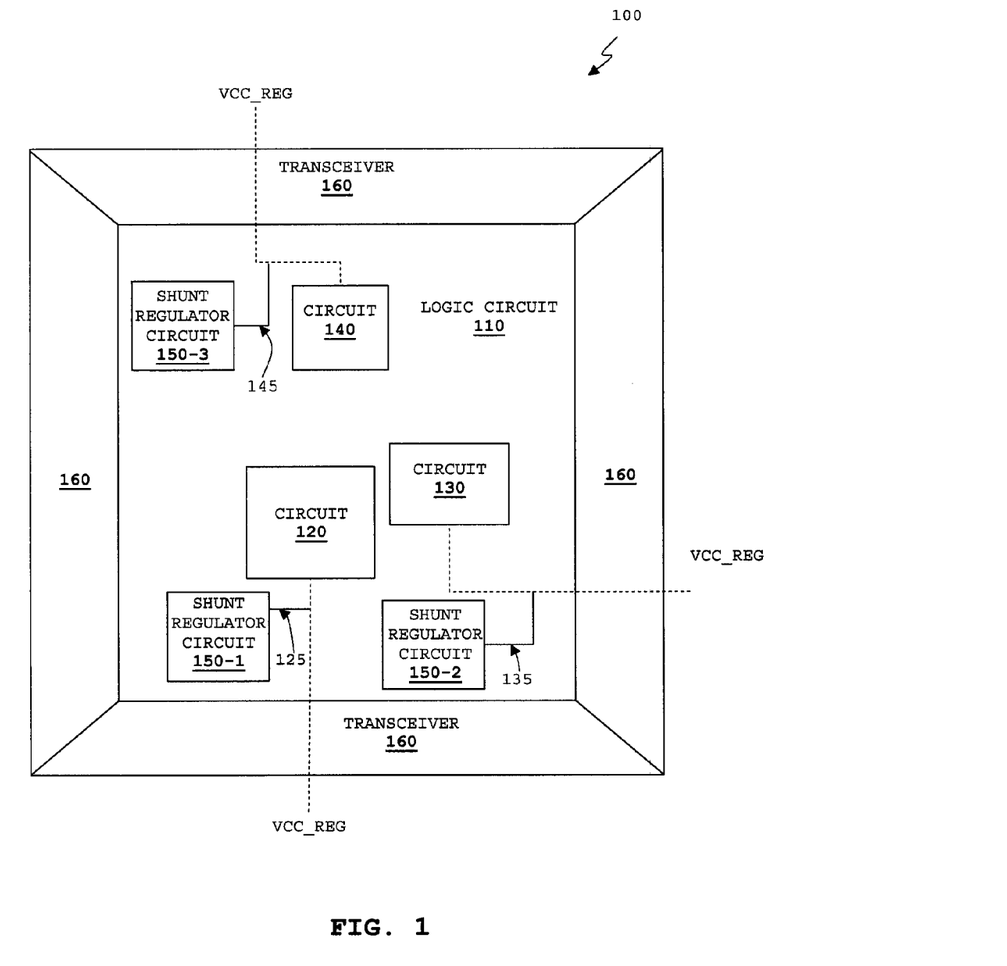
FIG. 1 shows an integrated circuit with regulator circuits in accordance with one embodiment of the present invention.

FIG. 1, meant to be illustrative and not limiting, illustrates an integrated circuit with regulator circuitry in accordance with one embodiment. Integrated circuit 100 may be a programmable logic device (PLD) such as a field programmable gate array (FPGA) device. Alternatively, integrated circuit 100 may be an application specific integrated circuit (ASIC) device or an application specific standard product (ASSP) device. Integrated circuit 100 may be capable of performing specific functions. For example, when used as a memory device or a memory controller, integrated circuit 100 may be used to store information and retrieve the stored information.

Still referring to FIG. 1, integrated circuit 100 includes a plurality of transceivers 160 surrounding logic circuit 110. Transceivers 160 are located on the periphery of integrated circuit 100 and logic circuit 110 is located in the center region of integrated circuit 100. Transceivers 160 are capable of transmitting input/output (I/O) signals in or out of integrated circuit 100. Logic circuit 110 may process the received signals accordingly.

In one instance, logic circuit 110 may include a plurality of programmable logic elements and programmable interconnections. The programmable logic elements and the programmable interconnections may be programmed to perform a logical function (e.g., storing information and/or performing multiplication). Logic circuit 110 may also include a plurality of fixed-function circuits to perform the logical functions for which integrated circuit 100 may be designed to perform. For example, logic circuit 110 may include a plurality memory storage elements (e.g., 1 transistor-1 capacitor (1T1C) for random access memory (RAM) elements) when integrated circuit 100 is a memory device.

In the embodiment of FIG. 1, there may be a plurality of shunt regulator circuits 150-1, 150-2, and 150-3, and circuits 120, 130 and 140 in logic circuit 110. Circuits 120, 130 and 140 may receive a regulated voltage signal VCC_REG from an external voltage source through respective pathways 125, 135 and 145. In one instance, as shown in FIG. 1, voltage VCC_REG may be received at different sides of integrated circuit 100. In another instance, integrated circuit 100 may receive VCC_REG via an input pad on one side of integrated circuit 100. It should be appreciated that VCC_REG may be generated by a single off-chip voltage regulator source or, in some instances, by multiple external voltage regulator sources. In one embodiment, the value of VCC_REG may depend on external voltage which varies in the range of 0.9 V to 1.1 V.

Circuits 120, 130 and 140 may be further coupled to their respective shunt regulator circuits 150-1, 150-2, and 150-3. In one embodiment, shunt regulator circuits 150 are located adjacent (or at a relatively near distance) to their respective circuits 120, 130 and 140. In one embodiment, having a shunt regulator circuit such as shunt regulator circuit 150 nearby may reduce the effect of signal cross-coupling noise to the VCC_REG voltage transmitting through respective pathways 125, 135 or 145.

Still referring to FIG. 1, the shunt regulator circuits 150-1, 150-2, and 150-3 may be coupled in parallel to their respective circuits 120, 130 or 140. For example, circuit 120 may be coupled in parallel to its corresponding shunt regulator circuit 150-1. Similarly, circuit 130 may be coupled in parallel to associated shunt regulator circuit 150-2.

Circuits 120, 130 and 140 of logic circuit 110 may perform various types of functions depending on their design. In one embodiment, circuits 120, 130 and 140 may include analog circuits. For example, circuits 120 may be a phase-locked loop (PLL) circuit, a voltage controlled oscillator (VCO) circuit or a high-speed clock network circuit. It should be appreciated that circuits 120, 130 and 140 may be relatively more sensitive to variations in the VCC_REG voltage compared to other circuits on integrated circuit 100 (e.g., programmable logic circuits or memory element circuits). Therefore, it may be desirable to have a regulator circuit such as shunt regulator circuit 150 to regulate the voltage/current supplied to each of the circuits 120, 130 or 140.

Variations in the VCC_REG voltage may be caused by various factors. In one instance, there may be variations due to signal crosstalk interferences between logic circuitry 110 and pathways 125, 135 and 140. In another instance, the variations may be due signal crosstalk interferences from external circuits. Such variations may also be caused as a result of temperature variation, or supply voltage variation.

It should be appreciated that generally the variations experienced by VCC_REG may be due to signal crosstalk interferences that occur for a relatively short period. Such types of variations do not affect the average VCC_REG voltage level (i.e., the direct current (DC) voltage level). However, there may also be a fixed shift (permanent shift) to the average voltage level for the VCC_REG voltages when receiving the VCC_REG voltages for respective circuits 120, 130 or 140 from different parts of integrated circuit 100. In one instance, such a shift may be noticeable when integrated circuit 100 is a relatively large device. In such circumstances, the voltage level of VCC_REG received by circuits on one part of integrated circuit 100 (e.g. circuit 130) may be different from that received by circuits on another part of integrated circuit 100 (e.g., circuit 120). The difference in the respective DC voltage levels may be compensated through use of a tracking circuit (e.g., tracking circuit 210 of FIG. 2).

Shunt regulator circuits 150-1, 150-2, and 150-3 that are coupled to respective circuits 120, 130 and 140 may either source or sink the electrical current that is supplied to each of circuits 120, 130 and 140. The sourcing and sinking of the electrical current may depend on the voltage level of VCC_REG received by circuit 120, 130 or 140. For example, a corresponding shunt regulator circuit 150 may source additional electrical current when noise in the pathway (either pathway 125, 135 or 145) inadvertently reduces the electrical current that is supplied to its corresponding circuit (circuit 120, 130 or 140). Alternatively, the corresponding shunt regulator circuit 150 may sink the electrical current by providing a shorted path to ground when noise in the pathway (either pathway 125, 135 or 145) inadvertently increases the electrical current supplied to its corresponding circuit (either circuit 120, 130 or 140). Therefore, the electrical current supplied to each of circuits 120, 130 and 140 may be identical and within a specific range.

Although the respective shunt regulator circuits 150-1, 150-2 and 150-3 are formed near the core of device 100, it should be appreciated that shunt regulator circuits 150-1, 150-2 and 150-3 may be formed near the boundaries of device 100.

Figure 2:
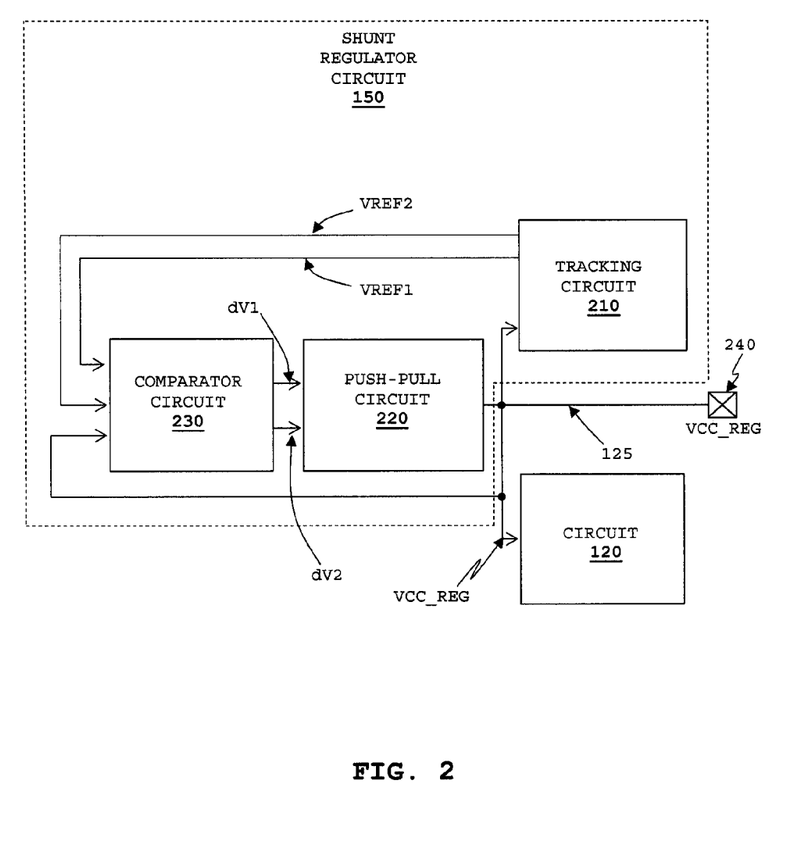
FIG. 2 shows circuit blocks within a regulator circuit in accordance with one embodiment of the present invention.

FIG. 2, meant to be illustrative and not limiting, shows circuit blocks that can be used to implement a shunt regulator circuit (e.g., 150-1, 150-2, or 150-3) in accordance with one embodiment. In the example of FIG. 2, shunt regulator circuit 150 may be coupled to circuit 120. However, it should be appreciated that shunt regulator circuit 150 may also be coupled to circuit 130 or 140 or other sensitive circuitry on device 100 of FIG. 1.

Shunt regulator circuit 150 may receive the VCC_REG via input-output pad 240. The VCC_REG may be at a particular voltage level, for example, 1.0 volt (V). Pad 240 may be located on a surface of an integrated circuit (e.g., on a surface of integrated circuit 100 of FIG. 1). Furthermore, pad 240 may be coupled to an external voltage regulator circuit (not shown). Within the device, pad 240 may be coupled to circuits that may utilize the regulated voltage (e.g., circuit 120). Pad 240 may also be coupled to regulator circuit 150 to regulate the regulated voltage, which could be affected by signal crosstalk interference while being transferred to circuit 120.

It should be appreciated that the external voltage regulator may generate VCC_REG with a relatively stable direct current (DC) value. However, when the VCC_REG is transferred through a transmission pathway (e.g., pathway 125 that is coupled to pad 240) the VCC_REG may be affected by random noise. In one embodiment, the VCC_REG that is transmitted to circuit 120 may be affected by crosstalk signal interferences from circuits around pathway 125. As described in FIG. 1, as VCC_REG is transmitted to different circuits (e.g., circuits 120, 130 and 140 as shown in FIG. 1) through their respective pathways (e.g., pathways 125, 135 and 145 of FIG. 1) it may be affected by different crosstalk signal interferences. In one embodiment, the VCC_REG may switch to a different DC value when the crosstalk signal interference affecting it is constant and has sufficiently large amplitude.

In one embodiment, the VCC_REG voltage level may be at 1.0 volt (V) because having a lower voltage (e.g., lower than 1.0 V) may prevent effective isolation of noise from VCC_REG and having a higher voltage (e.g., higher than 1.0 V) may cause a substantial part of the VCC_REG voltage to be wasted. The VCC_REG may be applied to circuit 120. Shunt regulator circuit 150 is coupled to circuit 120 and pad 240 in a parallel configuration.

As shown in FIG. 2, shunt regulator circuit 150 may include tracking circuit 210, push-pull circuit 220, and comparator circuit 230. Pathway 125 provides a means to couple pad 240 to tracking circuit 210, push-pull circuit 220, and comparator circuit 230. Pathway 125 may receive VCC_REG from an external source. In one embodiment, pathway 125 may be a transmission path used for transferring signals or voltages.

Tracking circuit 210, upon receiving the VCC_REG voltage, may generate two reference voltages (e.g., VREF1 and VREF2). In one embodiment, the voltage level of VREF1 may be higher than the voltage level of VCC_REG. Accordingly, the voltage level of VREF2 may be lower than the voltage level of VCC_REG. Therefore, in one embodiment, the voltage level of VCC_REG may be at an intermediate level between reference voltage levels VREF1 and VREF2.

It should be appreciated that the voltage range between VREF1 and VCC_REG, and the voltage range between VREF2 and VCC_REG may be referred to as a dead-band voltage range. Variations on VCC_REG within the dead-band voltage range may not trigger shunt regulator circuit 150 to further regulate the VCC_REG voltage. However, when the value of VCC_REG is higher than VREF1 or lower than VREF2, shunt regulator circuit 150 may further regulate VCC_REG. It should be appreciated that the dead-band range between VREF1 and VCC_REG or VREF2 and VCC_REG is a narrow range.

The voltages, VREF1 and VREF2, may be used as voltage limits for shunt regulator circuit 150. In one embodiment, VREF1 and VREF2 may be used by shunt regulator circuit 150 to determine whether to source or sink the electrical current supplied to circuit 120. For instance, when the value of VCC_REG is greater than the value of VREF1, shunt regulator circuit 150 may sink the excess current supplied to circuit 120. Conversely, when the value of VCC_REG is lower than the value of VREF2, shunt regulator circuit 150 may source additional current/voltage to compensate the reduction in the current/voltage supplied to circuit 120.

In the embodiment of FIG. 2, VREF1 and VREF2 are fed to comparator circuit 230. Comparator circuit 230 compares VREF1 and VREF2 with the value of VCC_REG. When the value of the VCC_REG exceeds the range between VREF1 and VREF2, the voltage difference between VCC_REG and VREF1 (referred to herein as "dv1") and the voltage difference between VCC_REG and VREF2 (referred to herein as "dv2") may be supplied to push-pull circuit 220. Push-pull circuit 220 may subsequently compensate for the drop or the increase (e.g., a drop or an increase in voltage may be due to noise) in VCC_REG.

Figure 3:
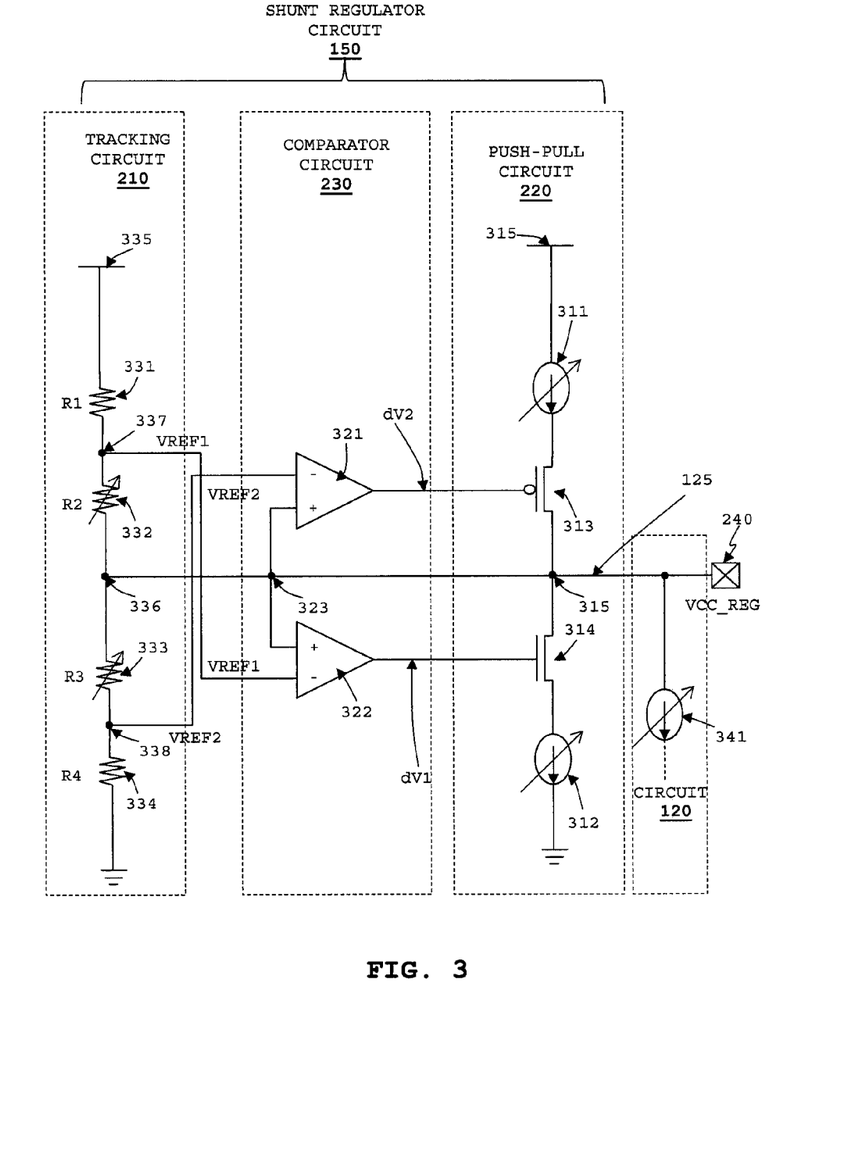
FIG. 3 shows detailed implementations of a tracking circuit, a comparator circuit, and a push-pull circuit in accordance with one embodiment of the present invention.

FIG. 3, meant to be illustrative and not limiting, shows an implementation of tracking circuit 210, comparator circuit 230, and push-pull circuit 220, in accordance with one embodiment. It should be appreciated that FIG. 3 shares similarities with FIG. 2 and as such, for the sake of brevity, elements that have been described above (e.g., pad 240 and pathway 125) will not be described again. Circuit 120 may include a configurable current source (e.g., configurable current source 341) that may provide different electrical current levels to circuit 120 depending on different design requirements.

In the embodiment of FIG. 3, tracking circuit 210 includes resistors 331-334 that are coupled in series (or a resistive ladder formation). Each resistor 331-334 has two terminals. As shown in FIG. 3, one of the terminals of resistor 331 is coupled to a terminal of resistor 332. Another terminal of resistor 332 is coupled to a terminal of resistor 333. Another terminal of resistor 333 may be coupled to a terminal of resistor 334. The remaining terminal of resistor 331 may be coupled to voltage supply terminal 335, and the remaining terminal of resistor 334 may be coupled to ground.

Tracking circuit 120 receives VCC_REG voltage at node 336 between resistors 332 and 333. Node 336 may be a point where resistors 332 and 333 intersect with pathway 125. Voltage supply terminal 335 may supply a positive power supply voltage VCC. In one embodiment, the VCC voltage level may be at 1.5 V. The VCC voltage level may need to be higher than the VCC_REG voltage level to generate two different reference voltages. Reference voltage VREF1 may have a voltage level higher than that of VCC_REG voltage level, whereas and reference voltage VREF2 may have a voltage level lower than that of VCC_REG. In one instance, voltage supply terminal 335 may be coupled to a bandgap circuit (not shown) to generate a precise VCC voltage level. In one embodiment, a programmable bandgap circuit may adjust the VCC voltage level applied to voltage supply terminal 335. It should be appreciated that a bandgap circuit generally generates a sufficiently precise and consistent voltage.

Still referring to FIG. 3, node 337 is located between resistors 331 and 332 while node 338 is located between resistors 333 and 334. In one embodiment, node 337 may be at voltage level VREF1 and node 338 may be at voltage level VREF2. The voltage levels VREF1 and VREF2 may depend on the resistance of the respective resistors 331-334. As shown in FIG. 3, resistor 331 has a resistance of R1, resistor 332 has a resistance of R2, resistor 333 has a resistance of R3, and resistor 334 has a resistance of R4.

In one embodiment, VREF1 may be a function of VCC_REG, R1, and R2 as shown in equation (1) below:

$$VREF1 = (VCC - VCC\_REG) \times R2/(R1+R2) + VCC\_REG \quad (1)$$

Accordingly, VREF2 may be a function of VCC_REG, R3 and R4 as shown in equation (2) below:

$$VREF2 = (VCC\_REG - VSS) \times R4/(R3+R4) + VSS \quad (2)$$

Based on equations (1) and (2), VREF1 and VREF2 may proportionally track the variation in the DC voltage level of VCC_REG. For example, when VCC_REG increases by VDELTA, the new VREF1 and VREF2 based on equations (1) and (2) are as follows:

$$VREF1 = (VCC - VCC\_REG - VDELTA) \times R2/(R1+R2) + VCC\_REG + VDELTA \quad (3)$$

$$VREF2 = (VCC\_REG + VDELTA - VSS) \times R4/(R3+R4) + VSS \quad (4)$$

Equations (1) and (2) may be derived with simple voltage divisional resistor circuit. It should be appreciated that further refinements to VREF1 and VREF2 may be achieved by changing the manner in which resistors 331-334 are coupled together.

Still referring to FIG. 3, resistors 332 and 333 may be programmable resistors. Both resistors 332 and 333 may be programmed to have different resistance values, R2 and R3, respectively. In one embodiment, programmable resistors 332 and 333 may be programmed through configuration random access memory (CRAM). By altering the respective resistance values R2 and R3, the voltage levels of VREF1 and VREF2 may be changed as shown in equations (1) and (2). In an alternative embodiment, resistors 331 and 334 may also be programmable resistors (not shown). Having resistors 331 and 334 programmable may further increase refinements in terms of VREF1 and VREF2 values.

Tracking circuit 210 may generate the reference voltages VREF1 and VREF2 without user intervention. In one embodiment, tracking circuit 210 may track the changes in the DC voltage level of VCC_REG. The tracking circuit 210 can be advantageously used to automatically adjust the reference voltages VREF1 and VREF2 such they are within a predetermined respective target range by automatically adjusting the resistance values of the resistors R2 and R3 is response to changes in the DC voltage level of VCC_REG. The tracking circuit 210, in such circumstances, may automatically adjust the VREF1 and VREF2 voltage levels to prevent unnecessary sinking or sourcing of electrical current.

In the embodiment shown in FIG. 3, the VREF2 and VREF1 voltage levels generated by tracking circuit 210 are applied to the negative terminals of comparators 321 and 322, respectively. The comparators 321 and 322 may be operational amplifier (op-amps). The positive terminals of comparators 321 and 322 receive the VCC_REG voltage level through node 323 on pathway 125.

Referring still to FIG. 3, comparator 321 compares the VCC_REG voltage level with the VREF2 voltage level while comparator 322 compares the VCC_REG voltage level with the VREF1 voltage level. The output of comparator 321 may be dV2 (i.e., VCC_REG−VREF2) and the output of comparator 322 may be dV1 (i.e., VREF1−VCC_REG).

It should be appreciated that comparators 321 and 322 may have a high cutoff frequency bandwidth. Furthermore, comparators 321 and 322 may be designed to have low latency. Therefore, comparators 321 and 322 may be able to respond sufficiently rapidly to reduce noise in the regulated voltage.

The voltage signals dV1 and dV2 may be coupled to n-type metal oxide semiconductor (NMOS) transistor 314 and p-type metal oxide semiconductor (PMOS) transistor 313, respectively, in push-pull circuit 220. Push-pull circuit 220 includes two current sources 311 and 312. In one embodiment, current sources 311 and 312 are configurable current sources that may be programmed to output different electrical current levels.

In the embodiment shown in FIG. 3, the drain terminal of PMOS transistor 313 is coupled to current source 311 while the source terminal is coupled to source terminal of NMOS transistor 314. The drain terminal of NMOS transistor 314 is coupled to current source 312. Power supply terminal 315 supplies a VCC voltage (e.g., 1.5V) to current source 311, and current source 312 is coupled to ground.

Pathway 125 intersects with push-pull circuit 220 at node 315. Therefore, node 315 may be at the VCC_REG voltage level. In one embodiment, current source 311 may compensate the electrical current supplied to circuit 120 when the VCC_REG voltage level drops below VREF2. When the VCC_REG voltage level is below the voltage level of VREF2, comparators 321 and 322 may generate a dV2 voltage level at 0 V and a dV1 voltage level below 0 V, respectively. When the dV1 and dV2 are applied to respective NMOS transistor 314 and PMOS transistor 313, PMOS transistor 313 may be activated and NMOS transistor 314 may be deactivated. Therefore, current source 311 may supply electrical current to circuit 120 via PMOS transistor 313, node 315 and pathway 125.

In another embodiment, current source 312 may sink the electrical current supplied to circuit 120 when the VCC_REG voltage level goes above VREF1 (e.g., when comparators 321 and 322 outputs dV2 above 1.0 V and dV1 at 1.0 V, respectively). When dV1 and dV2 are applied to respective NMOS transistor 314 and PMOS transistor 313, PMOS transistor 313 may be deactivated and NMOS transistor 314 may be activated. Accordingly, current source 311 may sink the excess electrical current applied to circuit 120 through pathway 125, node 315 and NMOS transistor 314.

It should be appreciated that the embodiments above describe the function of shunt regulator circuit 150 when the VCC_REG voltage changes with respect to VREF1 and VREF2. However, on the average, the VCC_REG voltage level remained within the range covered by the VREF1 and VREF2 voltage levels.

In one embodiment, the DC voltage level of VCC_REG may go above the VREF1 voltage level. In this instance, apart from using current source 312 to sink the excess electrical current supplied to circuit 120, tracking circuit 210 may adjust the VREF1 and VREF2 voltage levels according to the new DC voltage value of VCC_REG voltage as shown in equations (1) and (2) described above. Alternatively, in another embodiment, the DC voltage level of VCC_REG voltage level may go below the VREF2 voltage level. In this scenario, in addition to using current source 311 to compensate for the reduced current supplied to circuit 120, tracking circuit 210 may also adjust the VREF1 and VREF2 voltage levels according to the new DC value of VCC_REG voltage. Once there are new VREF1 and VREF2 voltage levels, the VCC_REG voltage level may fall within the new VREF1 and VREF2 voltage levels and current sourcing/sinking performed by push-pull circuit 220 may end. However, if the DC voltage of VCC_REG is not changed, but due to noise or voltage droop, the VCC_REG is changed, then the VREF1 and VREF2 are not expected to change.

It should be appreciated that any variations of the VCC_REG voltage level between the VREF1 and VREF2 voltage levels that do not affect the DC voltage level of the VCC_REG voltage level will not trigger regulator circuit 150 to adjust the VREF1 and VREF2 voltage levels or to source/sink the electrical current supplied to circuit 120.

Figure 4:
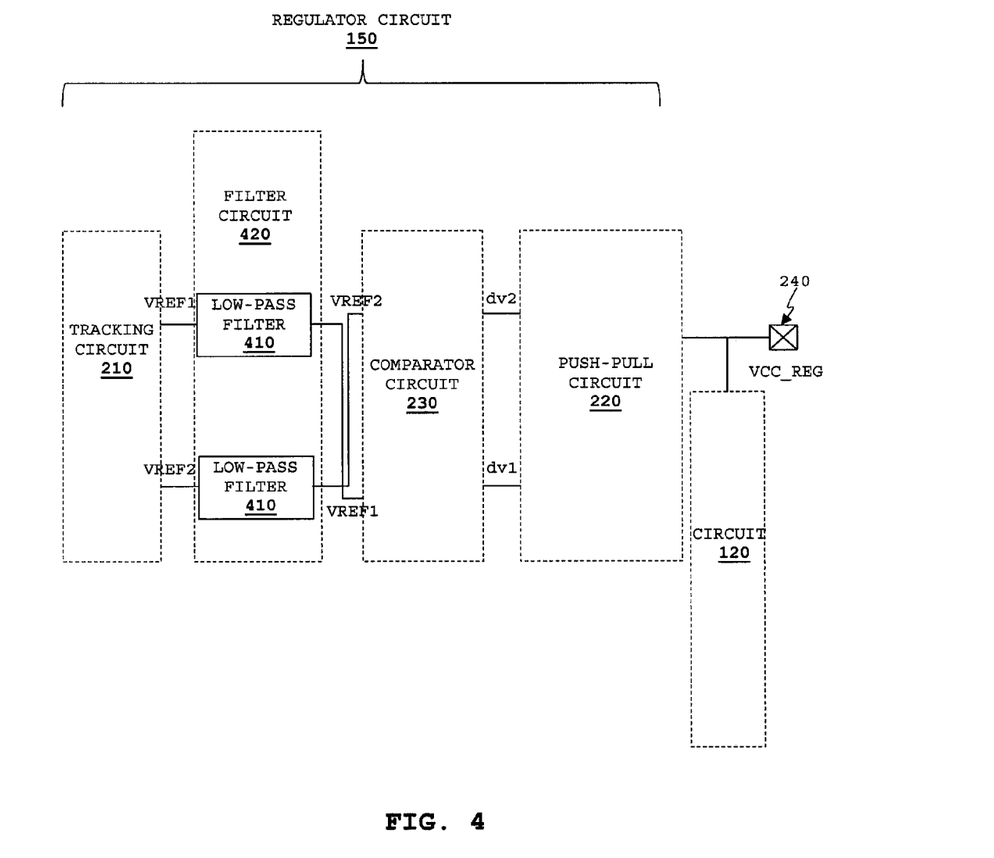
FIG. 4 shows another implementation of a regulator circuit in accordance with one embodiment of the present invention.

FIG. 4, meant to be illustrative and not limiting, illustrates another implementation of regulator circuit in accordance with one embodiment of the present invention. Regulator circuit 150 may be similar to regulator circuit 150 of FIG. 3 with an additional filter circuit 420 placed between tracking circuit 210 and comparator circuit 230. Circuit elements forming tracking circuit 210, comparator circuit 230, push-pull circuit 220 and circuit 120 may be similar to the circuit elements forming the respective tracking circuit 210, comparator circuit 230, push-pull circuit 220 and circuit 120 of FIG. 4. Filter circuit 420 includes two low-pass filters 410.

The first low-pass filter 410 is coupled between node 337 and the negative terminal of comparator 321. The second low-pass filter 410 is coupled between terminal 338 and the negative terminal of comparator 322. Low-pass filters 410 receive the respective VREF1 and VREF2 voltages from respective terminals 337 and 338. Low pass filters 410 may filter away any unwanted high frequency noise within in the respective VREF1 and VREF2 voltages. It should be appreciated that the high frequency noise may be generated as a result of the long pathway through which the VREF1 and VREF2 voltage levels are transferred and the proximity of other circuits around the pathway.

Figure 5:
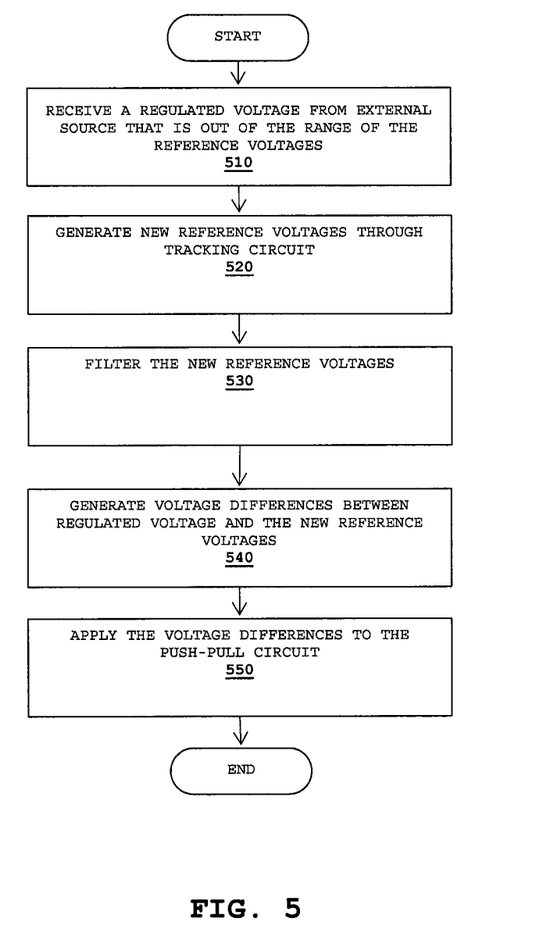
FIG. 5 shows illustrative steps for operating a shunt regulator circuit having a voltage tracking circuit and comparator circuits in accordance with one embodiment of the present invention.

FIG. 5, meant to be illustrative and not limiting, shows steps for operating a shunt regulator circuit that includes a voltage tracking circuit and comparator circuit in accordance with one embodiment of the present invention. The shunt regulator circuit may be similar to regulator circuit 150 shown in FIGS. 2-4.

At step 510, the shunt regulator circuit receives a regulated voltage from an external source. In one embodiment, the regulated voltage may be out of the range of the limit provided by specific reference voltages. The regulated voltage may be similar to the regulated voltage, VCC_REG, of FIGS. 2-4. The regulated voltage may be received from the external source through pad 240 of FIGS. 2-4. In the embodiments of FIGS. 2-4, the reference voltages may be VREF1 and VREF2. In one embodiment, the voltage level of VREF1 may be greater than that of VREF2. Hence, the regulated voltage may be out of the range provided by the reference voltages when the DC value for the regulated voltage is greater than the voltage level of VREF1 or lower than the voltage level of VREF2.

At step 520, new reference voltages are generated with a tracking circuit. The tracking circuit may be similar to tracking circuit 210 of FIGS. 2-4. The two new reference voltages may have values that change in response to changes in the value of VCC_REG. In one embodiment, the two new reference voltages may satisfy the following equations (1) and (2).

The tracking circuit may continuously monitor the regulated voltage and may automatically adjust the reference voltages accordingly.

At step 530, the new reference voltages are filtered using low-pass filters. However, step 530 may be an optional step. In one embodiment, the filtering is performed by low-pass filters 410 of FIG. 4. The low-pass filters may remove high frequency noise from the new reference voltages. Subsequently, the new reference voltages are provided to their respective comparators. In one embodiment, the new reference voltages are provided at the negative terminal of the respective comparators. For example, in the embodiment of FIG. 4, the reference voltages generated by tracking circuit 210, VREF1 and VREF2, are coupled to the negative terminal of comparators 322 and 321, respectively.

At step 540, voltage differences between the regulated voltage and the new reference voltages are generated. In the embodiment of FIG. 3, the voltage differences are represented, respectively, by dV1 and dV2. At step 550, the voltage differences may be applied to a push-pull circuit. In one instance, additional current may be supplied to a targeted circuit based on the voltage differences. In another instance, excess current may be routed through a pathway to ground when the regulated voltage is greater than the higher reference voltage of the two reference voltages.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Although the foregoing invention has been described in some detail for the purposes of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit comprising shunt regulator circuitry, wherein the shunt regulator circuitry comprises:
   a shunt regulator circuit having an output on which a regulated voltage is provided, wherein the shunt regulator circuit provides current to the output when the regulated voltage is outside of a voltage range bounded by first and second reference voltages; and
   a voltage tracking circuit coupled to the shunt regulator circuit, wherein the voltage tracking circuit generates the first and second reference voltages, wherein the first voltage is greater than the regulated voltage, wherein the second voltage is less than the regulated voltage, and wherein the voltage tracking circuit comprises:
      a positive power supply terminal;
      first and second resistors coupled in series between the output of the shunt regulator circuit and the positive power supply terminal;
      a ground power supply terminal; and
      third and fourth resistors coupled in series between the output of the shunt regulator circuit and the ground power supply terminal.

2. The integrated circuit as defined in claim 1, wherein the voltage tracking circuit continuously updates the first and second reference voltages in accordance with variations in the regulated voltage.

3. The integrated circuit as defined in claim 1, wherein the shunt regulator circuit comprises:
   first and second switches coupled in series, wherein the first switch is turned on to supply current to the output, and wherein the second switch is turned on to draw current from the output.

4. The integrated circuit as defined in claim 3, wherein the first and second switches each have a terminal that is coupled to the output of the shunt regulator circuit.

5. The integrated circuit as defined in claim 1, wherein the shunt regulator circuitry further comprises:
   first and second comparator circuits, wherein the first comparator circuit compares the regulated voltage to the first reference voltage and wherein the second comparator circuit compares the regulated voltage to the second reference voltage.

6. Regulator circuitry, comprising:
   a shunt regulator circuit that has an output on which a regulated voltage is provided, wherein the shunt regulator circuit provides a direct current path between the output and a selected power supply line when the regulated voltage is outside a voltage range that is bounded by first and second reference voltages; and
   a tracking circuit that generates the first and second reference voltages, wherein the tracking circuit includes a resistive chain coupled in series between a positive power supply terminal and a ground power supply terminal, wherein the resistive chain includes a first intermediate node that directly receives the regulated voltage from the shunt regulator circuit, a second intermediate node on which the first reference voltage is provided, and a third intermediate node on which the second reference voltage is provided, and wherein the second and third intermediate nodes are coupled to corresponding control inputs of the shunt regulator circuit.

7. The regulator circuitry as defined in claim 6, further comprising:
   filter circuitry that is coupled between the tracking circuit and the shunt regulator circuit.

8. The regulator circuitry as defined in claim 7, wherein the filter circuitry comprises a plurality of low-pass filters.

9. The regulator circuitry as defined in claim 6, wherein only a subset of resistors in the resistive chain comprises programmable resistors.

10. The regulator circuitry as defined in claim 6, wherein the first reference voltage is greater than the regulated voltage and the second reference voltage is less than the regulated voltage.

11. The regulator circuitry as defined in claim 6, wherein the shunt regulator circuit and the tracking circuit receives the regulated voltage from an external voltage source.

12. The regulator circuitry as defined in claim 6, wherein the shunt regulator circuit comprises a push-pull shunt regulator circuit.

13. Circuitry, comprising:
   a voltage regulator circuit having an output on which a regulated voltage is provided; and
   a voltage tracking circuit that is coupled to the voltage regulator circuit and that generates first and second time-varying reference voltages that are used to regulate the regulated voltage at the output of the voltage regulator circuit, wherein the time-varying reference voltages automatically track variations in the regulated voltage while ensuring that the regulated voltage is greater than the first time-varying reference voltage and less than the second time-varying reference voltage, and wherein the voltage regulator circuit is configured to sink excess current from the output when the regulated voltage rises above the second time-varying reference voltage.

14. The circuitry defined in claim 13, wherein the voltage tracking circuit comprises a resistive chain.

15. The circuitry defined in claim 14, wherein the resistive chain includes at least one adjustable resistive circuit.

16. The circuitry defined in claim 13, wherein the voltage tracking circuit comprises low pass filter circuitry.

17. The circuitry defined in claim 13, wherein the voltage regulator circuit includes a plurality of comparator circuits each of which has an input that is coupled to the output of the voltage regulator circuit and another input that receives a respective one of the time-varying reference voltages from the voltage tracking circuit.

18. The circuitry defined in claim 17, wherein the voltage regulator circuit further includes a plurality of switches that are coupled in series and that receive control signals from the plurality of comparator circuits, and wherein the output of the voltage regulator circuit is interposed between the plurality of switches.

19. The regulator circuitry as defined in claim 6, wherein the first intermediate node in the resistive chain is coupled between the second and third intermediate nodes.

20. The circuitry defined in claim 13, wherein the voltage regulator circuit includes a comparator having an input that is directly connected to the output, and wherein the voltage tracking circuit also includes a resistive circuit that is coupled between the output and a node at which the first time-varying reference voltage is generated.

* * * * *